(12) United States Patent
Tanabe et al.

(10) Patent No.: US 7,388,228 B2
(45) Date of Patent: *Jun. 17, 2008

(54) DISPLAY DEVICE AND METHOD OF MANUFACTURING THE SAME

(75) Inventors: Hideo Tanabe, Mobara (JP); Shigeo Shimomura, Mobara (JP); Makoto Ohkura, Fuchu (JP); Masaaki Kurita, Mobara (JP); Yasukazu Kimura, Mobara (JP); Takao Nakamura, Mobara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/174,674

(22) Filed: Jul. 6, 2005

(65) Prior Publication Data

US 2005/0242354 A1    Nov. 3, 2005

Related U.S. Application Data (63) Continuation of application No. 10/408,451, filed on Apr. 8, 2003, now Pat. No. 6,936,847, which is a continuation of application No. 10/066,702, filed on Feb. 6, 2002, now Pat. No. 6,624,443.

(30) Foreign Application Priority Data

Feb. 6, 2001    (JP)    .............................. 2001-029050
Jan. 29, 2002    (JP)    .............................. 2002-019751

(51) Int. Cl.
*H01L 21/84*    (2006.01)
*H01L 29/76*    (2006.01)

(52) U.S. Cl. .................... 257/72; 257/59; 257/344; 257/408; 257/E21.2; 257/E27.111; 257/E29.151; 257/E21.279

(58) Field of Classification Search .................. 257/72, 257/59, 344, 408; 438/151–152, 155–156, 438/162–164
See application file for complete search history.

(56) References Cited

U.S. PATENT DOCUMENTS 5,279,308 A    1/1994    DiSabito et al.
5,292,675 A    3/1994    Codama (Continued)

FOREIGN PATENT DOCUMENTS

JP    08-036771    2/1996

(Continued)

*Primary Examiner*—Ahmed Sefer
(74) *Attorney, Agent, or Firm*—Antonelli, Terry, Stout & Kraus, LLP.

(57) ABSTRACT

Thin film transistors for a display device each include a semiconductor layer made of polysilicon having a channel region, drain and source regions at both sides of the channel region and doped with impurity of high concentration, and an LDD region arranged either between the drain region and the channel region or between the source region and the channel region and doped with impurity of low concentration. An insulation film is formed over an upper surface of the semiconductor layer and has a film thickness which decreases in a step-like manner as it extends to the channel region, the LDD region, the drain and the source regions; and a gate electrode is formed over the channel region through the insulation film. Such a constitution can enhance the numerical aperture and can suppress the magnitude of stepped portions in a periphery of the thin film transistor.

13 Claims, 8 Drawing Sheets

U.S. PATENT DOCUMENTS

| | | |
|---|---|---|
| 5,412,493 A | 5/1995 | Kunii et al. |
| 5,736,751 A | 4/1998 | Mano et al. |
| 5,956,105 A | 9/1999 | Yamazaki et al. |
| 5,962,916 A | 10/1999 | Nakanishi et al. |
| 5,977,559 A | 11/1999 | Zhang et al. |
| 6,034,748 A | 3/2000 | Furuta |
| 6,346,718 B1 | 2/2002 | Yamanaka et al. |
| 6,365,936 B1 | 4/2002 | Shimabukuro et al. |
| 6,384,427 B1 | 5/2002 | Yamazaki et al. |
| 6,395,586 B1 | 5/2002 | Huang et al. |
| 6,399,962 B1 | 6/2002 | Kim |
| 6,407,430 B1 | 6/2002 | Ohtani et al. |
| 6,429,485 B1 | 8/2002 | Ha et al. |
| 6,521,913 B1 | 2/2003 | Murade |
| 6,593,626 B2 | 7/2003 | Hirabayashi et al. |
| 6,773,944 B2 * | 8/2004 | Okamoto .................... 438/30 |
| 7,008,828 B2 * | 3/2006 | Ono et al. .................. 438/149 |
| 2001/0055841 A1* | 12/2001 | Yamazaki et al. .......... 438/151 |
| 2002/0053674 A1* | 5/2002 | Nakajima et al. ............. 257/72 |
| 2002/0098628 A1* | 7/2002 | Hamada et al. ............. 438/149 |
| 2002/0110941 A1* | 8/2002 | Yamazaki et al. ............ 438/25 |
| 2004/0016927 A1 | 1/2004 | Takei et al. |

FOREIGN PATENT DOCUMENTS

| | | |
|---|---|---|
| JP | 2001-029050 | 2/2001 |
| JP | 2002-019751 | 1/2002 |
| KR | 1999-39940 | 9/1999 |

* cited by examiner

DISPLAY DEVICE AND METHOD OF MANUFACTURING THE SAME

CROSS-REFERENCE TO RELATED APPLICATIONS

This is a Continuation Application of U.S. application Ser. No. 10/408,451, filed Apr. 8, 2003 (now U.S. Pat. No. 6,936,847), which, in turn, is a Continuation of U.S. application Ser. No. 10/066,702, filed Feb. 6, 2002 (now U.S. Pat. No. 6,624,443), the entire disclosures of which are hereby incorporated by reference.

BACKGROUND OF THE INVENTION

The present invention relates to a display device, and more particularly, to an active matrix type display device and a method of manufacture thereof.

In a typical liquid crystal display device, on a liquid-crystal-side surface of one of a pair of transparent substrates, which are arranged to face each other in an opposed manner with a liquid crystal material disposed therebetween, gate signal lines extend in the x direction and are arranged in parallel in the y direction and drain signal lines extend in the y direction and are arranged in parallel in the x direction, and respective regions surrounded by these signal lines define pixel regions.

On each pixel region, there is at least a thin film transistor, which is operated in response to scanning signals from a one-side gate signal line and a pixel electrode to which video signals are supplied from a one-side drain signal line through the thin film transistor. The pixel electrode generates an electric field between the pixel electrode and a counter electrode thus controlling the light transmittivity of the liquid crystal material. Further, as the thin film transistor, a transistor has been employed which uses a semiconductor layer which is referred to as a so-called a low-temperature polysilicon (p-Si) layer. Such a thin film transistor can be formed by a low temperature process at a temperature of not more than approximately 450° C.

There is a known liquid crystal display device in which a scanning driving circuit, which supplies scanning signals to the gate signal lines, and a video driving circuit, which supplies video signals to the drain signal lines, are formed on one of the above-mentioned substrates. Each driving circuit is comprised of a large number of complementary MIS transistors, because these MIS transistors can be formed along with the formation of the above-mentioned thin film transistors. As the constitution of such thin film transistors, the constitution which is disclosed in Japanese Laid-open Patent publication 163366/1999 has been known, for example.

With respect to a thin film transistor having such a constitution, so-called LDD (Lightly Doped Drain) regions are formed respectively between a channel region thereof and drain and source regions, which are formed at both sides of the channel region, and the widths of respective LDD regions are made uniform so as to make the magnitude of ON currents uniform.

These LDD regions are regions which are doped with an impurity having a concentration lower than the concentration of the impurity doped into the drain and source regions. The LDD regions are formed to alleviate the concentration of an electric field at these portions.

However, with respect to such a thin film transistor, no consideration has been given to the film thickness of an insulation film (functioning as a gate insulation film) which covers a channel region, an LDD region and the drain and source regions thereof. Accordingly, it has been pointed out that the areas of the tapered surfaces of contact holes cannot be reduced, so that the numerical aperture cannot be enhanced, or there arises a defect with respect to the coating ability of an interlayer insulation film due to the formation of a stepped portion in the periphery of a gate electrode of the thin film transistor.

The present invention has been made in view of such circumstances as described above, and it is an object of the present invention to provide a display device which can enhance the numerical aperture and can resolve defects which occur in a periphery of a gate electrode of a thin film transistor.

Further, it is another object of the present invention to provide a method of fabricating a display device which can reduce the voltage necessary for ion implantation of an impurity at the time of forming the thin film transistors.

SUMMARY OF THE INVENTION

A summary of typical examples of the invention described in this specification will be presented.

That is, a display device according to the present invention is characterized in that, for example, a thin film transistor is formed in pixel regions over at least one of a pair of substrates, which are arranged to face each other in an opposed manner with a liquid crystal material being disposed therebetween. Each thin film transistor includes a semiconductor layer made of polysilicon, which is comprised of a channel region, drain and source regions arranged at both sides of the channel region and doped with an impurity of high concentration, and at least an LDD region arranged between the drain region and the channel region and between the source region and the channel region, or between the drain region and the channel region, and doped with impurity of low concentration; an insulation film which is formed over an upper surface of the semiconductor layer and respectively sequentially decreases in film thickness thereof in a step-like manner as the insulation film is extended to the channel region, the LDD region, the drain and the source region or the drain region; and a gate electrode which is formed over the channel region through the insulation film.

In a display device having such a constitution, the film thickness of the insulation film on the drain and source regions can be made smaller than the film thickness of the insulation film on the channel region.

Accordingly, the tapered areas in the contact holes of the insulation film, which are formed for drain and source electrodes, can be reduced so that the areas of the respective electrodes can be reduced. Accordingly, the numerical aperture can be enhanced.

Further, since the insulation film can be made by stepped portions thereof divided in two stages in the course of reaching the drain and source regions from the channel region, substantially smooth oblique surfaces can be formed so that the drawbacks derived from the stepped portions can be resolved.

Further, a method of fabricating a display device according to the present invention is characterized in that, for example, a thin film transistor is formed over an insulation substrate through the following steps, comprising a step in which a semiconductor layer made of polysilicon, an insulation film and a conductive layer are formed over the substrate side; a step which uses the conductive film which remains on a channel region and an LDD region and performs ion plantation of an impurity of high concentration using the remaining conductive layer as a mask; and a step which uses the conductive film which remains on the channel region and performs ion plantation of an impurity of low concentration using the remaining conductive layer as a mask. A resist film, which is used for patterning the conductive layer, which is allowed to remain on the channel region, is formed of a portion obtained by removing a periphery of the resist film which is used for patterning the conductive layer that remains on the channel region and the LDD region, and at the time of making the conductive film that remains on the channel region and the LDD region and also on the channel region, by using the conductive film as a mask, a surface of the insulation film which is exposed from the mask is slightly etched.

In the method for fabricating the display device having such a constitution, at the time of performing ion implantation of the impurity of high concentration and ion implantation of the impurity of low concentration, respectively, the film thickness of the insulation film which constitutes a through film is made smaller than the film thickness of the insulation film formed over the channel region; and, hence, the voltage necessary for ion implantation can be reduced, so that damage to the insulation film can be minimized.

DETAILED DESCRIPTION OF THE PREFERRED EMBODIMENTS

Embodiments of a display device according to the present invention will be explained hereinafter in conjunction with the drawings.

Overall Constitutional View

Figure 2:
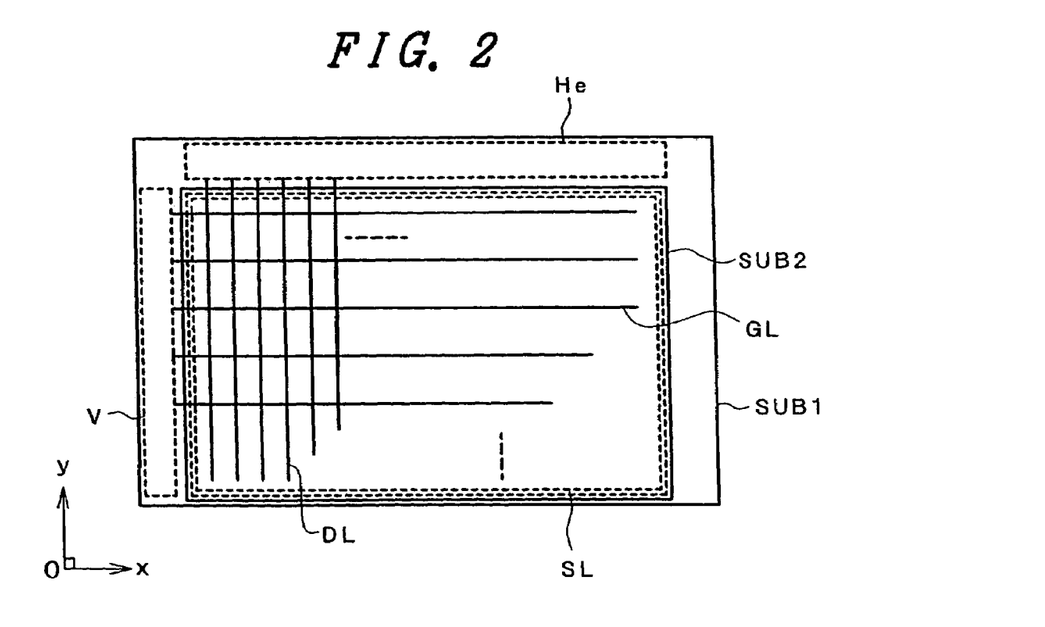
FIG. 2 is a schematic plan view showing one example of the display device according to the present invention.

FIG. 2 is an overall constitutional view showing one embodiment of a liquid crystal display device which constitutes one example of the display device according to the present invention. In the drawing, first of all, the liquid crystal display device is provided with a transparent substrate SUB1, and the transparent substrate SUB1 is arranged to face a transparent substrate SUB2 in an opposed manner with a liquid crystal material being disposed therebetween.

The transparent substrate SUB2 is formed to have an area slightly smaller than the area of the transparent substrate SUB1, and a lower-side surface thereof, as seen in the drawing, is coplanar with a lower-side surface of the transparent substrate SUB1. Accordingly, with respect to peripheral portions, excluding the lower side in the drawing, there exist exposed peripheral regions on the substrate SUB1 where the transparent substrate SUB2 does not cover the substrate SUB. On the liquid-crystal-side surface of the transparent substrate SUB1 in these exposed peripheral regions, a scanning driving circuit V and a video driving circuit He, which will be explained later, are formed.

On the liquid-crystal-side surface of the transparent substrate SUB1, gate signal lines GL extend in the x direction in the drawing and are arranged in parallel in the y direction, wherein one end (disposed at the left side in the drawing) of each of the gate signal lines GL is connected to the scanning driving circuit V. Further, also on the liquid-crystal-side surface of the transparent substrate SUB1, drain signal lines DL extend in the y direction in the drawing and are arranged in parallel in the x direction, wherein one end (disposed at the upper side in the drawing) of each of the drain signal lines DL is connected to the video driving circuit He.

Respective regions surrounded by respective gate signal lines GL and respective drain signal lines DL define pixel regions. Each pixel region is provided with a thin film transistor TFT, which is operated in response to scanning signals supplied from one-side gate signal line GL, and a pixel electrode PX to which video signals are supplied from a one-side drain, signal line DL through the thin film transistor TFT. An electric field is generated between the pixel electrode PX and a counter electrode CT, which is formed in common with respective pixel regions on the liquid-crystal-side surface of the transparent substrate SUB2, thus controlling the light transmittivity of the liquid crystal.

With respect to the thin film transistor TFT, a semiconductor layer thereof is formed of a so-called low-temperature polysilicon, for example. Further, the scanning driving circuit V and the video driving circuit He are respectively comprised of a large number of transistors which have substantially the same constitution as the thin film transistors TFT. These respective transistors also have low-temperature polysilicon as the material of the semiconductor layer and are formed along with the formation of the thin film transistor TFT.

The transparent substrate SUB2 is fixedly secured to the transparent substrate SUB1, by a sealing member SL, which also effects sealing of the liquid crystal material between the transparent substrates SUB1 and SUB2.

Constitution of Pixel

Figure 3:
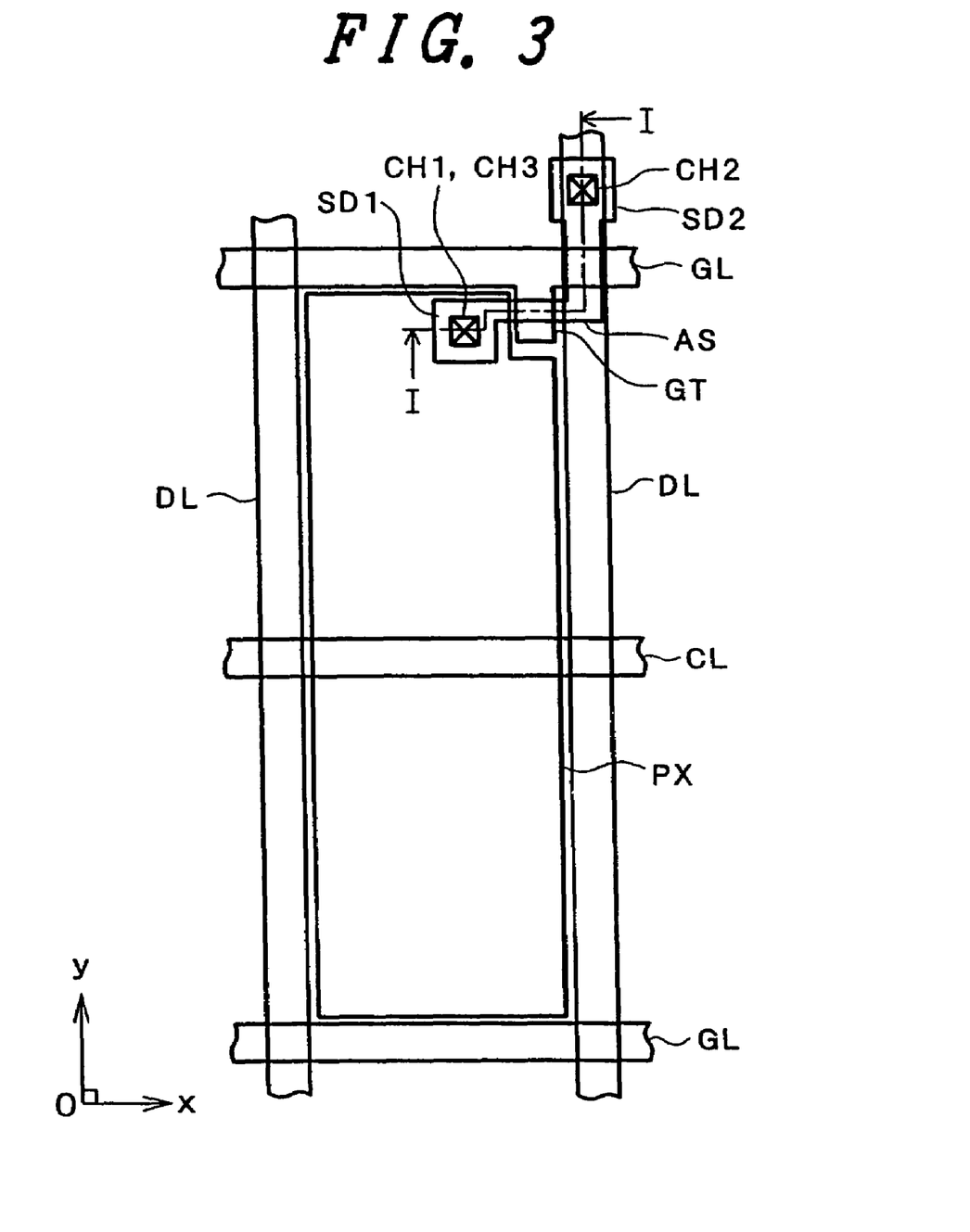
FIG. 3 is a plan view showing one example of a pixel of the display device according to the present invention.

FIG. 3 is a plan view of one embodiment showing the constitution of one pixel region out of plural pixel regions provided in the display device. Further, FIG. 1 is a cross-sectional view taken along a line I-I in FIG. 3.

On the liquid-crystal-side surface of the transparent substrate SUB1, first of all, a semiconductor layer AS made of polysilicon is formed. This semiconductor layer AS is a semiconductor layer which constitutes a thin film transistor TFT. The semiconductor layer AS is formed in an L-shaped pattern, for example, as seen in the drawing.

The semiconductor layer AS has one end portion thereof positioned inside of the pixel region surrounded by the gate signal lines GL and the drain signal lines DL, which will be explained later. Further, the semiconductor layer AS has the other end portion thereof superposed on the drain signal line DL. Respective end portions of the semiconductor layer AS are formed to ensure a relatively large area, thus constituting contact portions.

Figure 1:
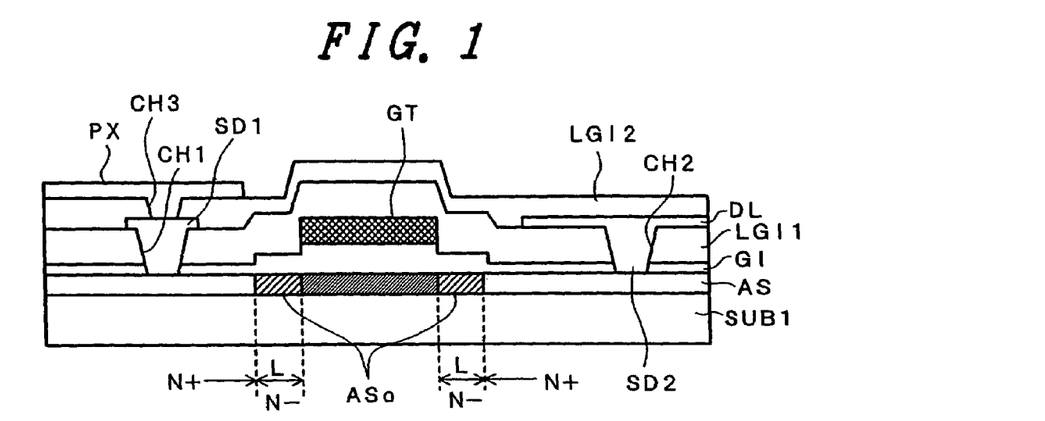
FIG. 1 shows one example of a thin film transistor of a display device according to the present invention and is a cross-sectional view taken along a line I-I of FIG. 3.

An insulation film GI made of $SiO_2$ is, for example, formed over the surface of the transparent substrate SUB1, such that the insulation film GI also covers the semiconductor layer AS (see FIG. 1). The insulation film GI mainly functions as a gate insulation film of the thin film transistor TFT and, hence, the film thickness thereof is set to a suitable value (approximately 100 nm) to serve as an insulation film.

Further, the gate signal lines GL, which extend in the x direction and are arranged in parallel in the y direction in the drawing, are formed over the surface of the insulation film GI. The gate signal line GL has an extension portion which is formed such that the extension portion intersects and sits astride a portion of the semiconductor layer AS, except for both ends of the semiconductor layer AS at a position in the vicinity of the thin film transistor TFT. The extension portion functions as a gate electrode GT of the thin film transistor TFT. In this embodiment, for example, Mo, Mo alloy (MoW, MoCr), Ti, Ti alloy (Tiw) can be used as material for the gate electrode GT (gate signal line GL).

A capacitance signal line CL, which runs parallel to the gate signal lines GL, is formed between the respective gate signal lines GL. The capacitance signal line CL is, for example, formed simultaneously with the formation of the gate signal lines GL. Accordingly, the capacitance signal line CL is made of the same material as the gate signal lines GL.

A first interlayer insulation film LGI1 made of $SiO_2$, for example, is formed over the surface of the transparent substrate SUB1 such that the first interlayer insulation film LGI1 also covers the gate signal lines GL and the capacitance signal line CL (see FIG. 1).

Contact holes CHI, CH2 are formed in the first interlayer insulation film LGI1, wherein the contact hole CH1 exposes a portion of a source region SD1 (region disposed at aside which is connected to the pixel electrode PX which will be explained later) of the thin film transistor TFT, and the contact hole CH2 exposes a portion of a drain region SD2 (region disposed at a side which is connected to the drain signal line DL which will be explained later) of the thin film transistor TFT.

On an upper surface of the first interlayer insulation film LGI1, the drain signal lines DL, which extend in the y direction and are arranged in parallel in the x direction in the drawing, are formed. The drain signal line DL is formed so as to be connected to the drain electrode SD2 of the thin film transistor TFT at a portion of the contact hole CH2.

Further, at the time of forming the drain signal lines DL, the source electrode SD1 of the thin film transistor TFT is formed at a portion of the contact hole CH1.

Then, on a surface of the transparent substrate SUB1, a second interlayer insulation film LGI2 made of SiN, for example, is formed such that the second interlayer insulation film LGI2 also covers the drain signal lines DL and the source electrode SD1. A contact hole CH3 is formed in the second interlayer insulation film LGI2. The contact-hole CH3 exposes a portion of the source electrode SD1 of the thin film transistor TFT.

Further, on an upper surface of the second interlayer insulation film LGI2, the pixel electrode PX made of ITO (Indium-Tin-Oxide) for example, is formed. The pixel electrode PX is formed such that the pixel electrode PX is disposed adjacent to the gate signal lines GL and the drain signal lines DL and occupies a major portion of the pixel region.

In the above-mentioned embodiment, gate electrode GT is integrally formed with the gate signal line GL. However, it is needless to say that the gate signal line GL can be made of a material different from the material of the gate electrode GT and they may be electrically connected to each other.

Thin Film Transistor TFT

FIG. 1 shows one embodiment of the thin film transistor TFT and is a cross-sectional view taken along a line I-I in FIG. 3.

The thin film transistor TFT has the semiconductor layer AS thereof made of polysilicon. Here, the semiconductor layer AS is formed of an i-type layer (intrinsic layer: layer which is not doped with conductive impurity) which is disposed right below the gate electrode GT, layers doped with an n-type impurity of relatively low concentration which are disposed at both sides of the i-type layer, and layers doped with an n-type impurity of relatively high concentration which are disposed at both sides of the layers doped with the n-type impurity of relatively low concentration.

The i-type semiconductor layer AS functions as a channel region of the thin film transistor TFT, and the layers doped with the n-type impurity of relatively high concentration respectively function as a drain region (region at a side which is connected to the drain signal line DL) and a source region (region at a side which is connected to the pixel electrode PX).

Further, the layers $AS_o$ doped with the n-type impurity of relatively low concentration function as layers which prevent a so-called drain avalanche hot carrier (DAHC) and are referred to as LDD (Lightly Doped Drain) regions. In these LDD regions, the electric field is alleviated, thus preventing the concentration of an electric current, whereby the reliability of the thin film transistor TFT can be enhanced.

Due to such a constitution, in this embodiment, the width L of the layer $AS_o$ extending from the channel region to the drain region and the width L of the layer $AS_o$ extending from the channel region to the source region are set accurately to the same value. That is, when the width L is set to an excessively large value, the resistance of the semiconductor layer AS is increased, while when the width L is set to an excessively small value, concentration of the electric field occurs.

Further, the film thickness of the insulation film GI which covers the semiconductor layer AS is set to approximately 100 nm (preferably not more than 100 nm) right above the channel region, not more than 90 nm right above the layers $AS_o$ which are doped with the n-type impurity having a small concentration, and not more than 80 nm, more preferably not more than 60 nm, right above the drain region and the source region.

In other words, the insulation film GI is configured so that the film thickness thereof is reduced in a step-like manner in the order of the portion thereof right above the channel region, the portion thereof right above the layers $AS_o$ which are doped with the n-type impurity having the small concentration, and the portions thereof right above the drain region and the source region, respectively.

Due to such a constitution, the film thickness of the insulation film GI right above the drain region and the source region becomes thinner than the film thickness of the insulation film GI right above the channel region by not less than 20 nm, and more preferably by not less than 40 nm.

This implies that the increase of areas occupied by tapers on the inner surfaces of the contact holes CH1, CH2 which are respectively formed in the drain region and the source region for forming electrodes can be prevented. Accordingly, an advantageous effect is achieved in that the numerical aperture of the pixel can be enhanced.

This advantageous effect becomes more apparent by setting the difference between the film thickness of the insulation film GI right above the layers $AS_o$ which are doped with the n-type impurity having the small concentration and the film thickness of the insulation film GI right above the drain and source regions to a value larger than the difference between the film thickness of the insulation film right above the channel region and a film thickness of the insulation film right above the layers $AS_o$ which are doped with the n-type impurity having the small concentration.

Further, with the provision of the insulation film GI having such a constitution, the stepped portions formed in the vicinity of the gate electrode GT are divided in two stages so that each step of each stepped portion becomes small, whereby an advantageous effect is achieved in that the coverage of the interlayer insulation films LGI1, LGI2 can be enhanced.

Still further, this implies that the insulation films LGI1, LGI2 can be formed relatively flat. Accordingly, an advantageous effect is achieved in that the disconnection of the signal lines or electrodes formed over respective interlayer insulation films LGI1, LGI2, which occurs due to the presence of the steps can be obviated.

Here, in this embodiment, although the film thickness of the insulation film GI right above the channel region is set to not more than 100 nm, the film thickness of the insulation film GI right above the layers $AS_o$ which are doped with the n-type impurity having the small concentration is set to not more than 90 nm, and the film thickness of the insulation film GI right above the drain region and the source region is set to not more than 60 nm, it is needless to say that these film thicknesses may be respectively set to not more than 80 nm, not more than 70 nm, and not more than 40 nm.

Method of Fabricating a Thin Film Transistor

One example of a method of fabricating a thin film transistor will be explained in conjunction with FIG. 4A to FIG. 4E.

Figure 4A:
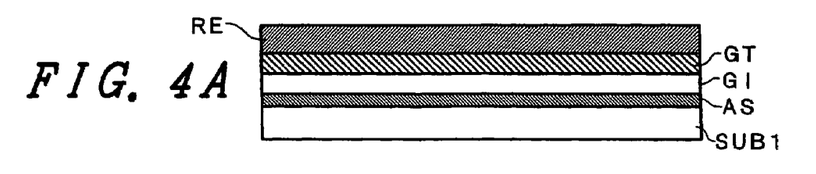
FIG. 4A to FIG. 4E are process flow diagrams showing one embodiment of a method of fabricating a display device according to the present invention.

Step 1. (FIG. 4A)

On the liquid-crystal-side surface of the transparent substrate SUB1, a semiconductor layer AS made of polysilicon, (p-Si), an insulation film made of $SiO_2$, for example, and a metal layer made of Cr or the like, for example, are laminated sequentially.

Here, the insulation film is formed of a material which functions as the gate insulation film GI, and the metal layer is formed of a material which functions as the gate electrode GT.

Further, although an insulation film having a relatively thick film thickness is formed, it is preferable to set the film thickness to not more than 100 nm. This is because the semiconductor layer AS made of p-Si is formed as a layer below the insulation film, and a thermal oxidation film having a favorable quality such as single-crystal silicon cannot be formed so that only the insulation film which can be formed at a low temperature can be formed, whereby it is difficult to make the film thickness thin due to the characteristics of the insulation film.

Then, a photo resist film RE is formed over a surface of the metal layer by coating, for example.

Figure 4B:
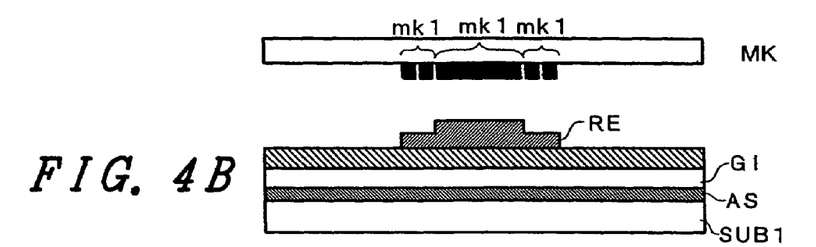

Step 2. (FIG. 4B)

The photo resist film RE is selectively exposed using a photo mask MK. Light shielding films mk are formed over regions of the photo mask MK which correspond to the channel region and portions disposed at both sides of the channel region of the thin film transistor TFT.

In this case, the light shielding film $mk_o$ which corresponds to the channel region of the thin film transistor TFT is formed such that the light shielding film $mk_o$ completely shields the light and the light shielding films $mk_1$, which are disposed at both sides of the light shielding film $mk_o$ are formed in a mesh form, for example, so as to partially shield the light (hereinafter, such an exposure is referred to as "half exposure" for convenience sake).

Here, the light shielding films $mk_1$ are portions which correspond to respective LDD regions formed over the semiconductor layer AS and are formed to have a width equal to the width of respective LDD regions.

By developing the photo resist film RE, which is exposed using such a photo mask MK, the photo resist film RE remains on the channel region and the regions which are disposed at both sides of the thin film transistor TFT, while the photo resist film RE is removed on other regions.

In this case, the remaining photo resist film RE exhibits a thick film thickness on the channel region and a thin film thickness on the regions corresponding to both sides of the channel region.

Figure 4C:
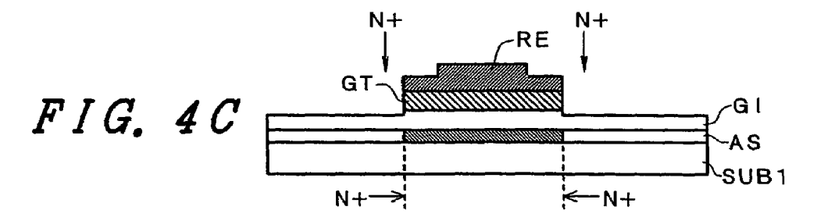

Step 3. (FIG. 4C)

Using the remaining photo resist film RE as a mask, the metal layer exposed from the mask is selectively etched so that the insulation film GI is exposed. In this case, the surface of the insulation film GI is slightly etched so that the film thickness of the exposed insulation film GI becomes slightly smaller than the film thickness of the insulation film GI below the mask.

Further, the ion implantation of the n-type impurity of high concentration is performed with the mask which remains. Due to such an ion implantation, ions of high concentration are implanted into the semiconductor layer AS below the insulation film at regions other than regions where the mask is formed so that the drain and source regions are formed.

Here, since the insulation film GI, which functions as a through film for ions at the time of the ion implantation, has a film thickness of not more than 100 nm, the acceleration voltage for the ion implantation can be lowered. Accordingly, the damage which the insulation film GI receives as the through film can be suppressed as much as possible whereby the subsequent activation can be performed easily.

Figure 4D:
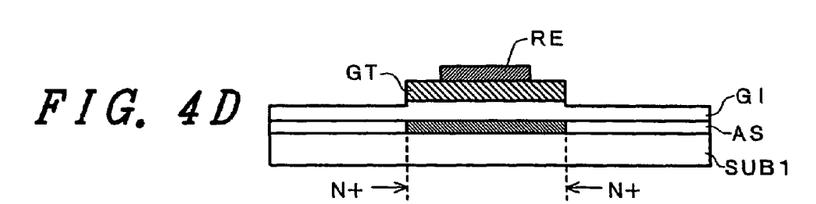

Step 4. (FIG. 4D)

By ashing the remaining photo resist film RE, the surface thereof is removed while retaining a portion thereof. That is, the ashing process is performed until the photo resist film RE having a large film thickness remains on the channel region, and the photo resist film RE having a small film thickness that is formed at both sides of the photo resist film RE having a large film thickness is removed.

Figure 4E:
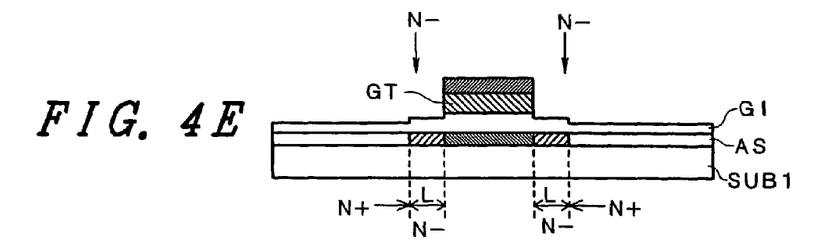

Step 5. (FIG. 4E)

Using the remaining photo resist film RE as a mask, the metal layer exposed from the mask is etched so that the gate electrode GT is formed and, at the same time, the insulation film GI at both sides of the channel region is exposed.

In this case, the surface of the insulation film GI is slightly etched and the film thickness of the exposed insulation film GI is made smaller than the film thickness of the insulation film GI below the mask. In this case, the insulation film GI on the drain and source regions has the surface thereof also slightly etched in the same manner.

Further, the ion implantation of the n-type impurity of low concentration is performed with the mask that remains. Due to such an ion implantation, ions of low concentration are implanted into the semiconductor layer below the insulation film at regions other than regions where the mask is formed so that the LDD regions are formed.

Here, since the insulation film GI, which functions as a through film for ions at the time of the ion implantation, has a film thickness of not more than 100 nm, the acceleration voltage for the ion implantation can be lowered. Accordingly, the damage which the insulation film GI receives as the through film can be suppressed as much as possible, whereby the subsequent activation can be performed easily.

Other Fabricating Method

FIG. 5A to FIG. 5D are process flow diagrams showing another embodiment of the method of fabrication of thin film transistors similar to the method shown in FIG. 4A to FIG. 4E.

In the drawings, steps of this fabricating method are the same as those of the fabricating method shown in FIG. 4A to FIG. 4E except for the formation of the photo resist film RE which is used at the time of forming the metal layer which is used as the gate electrode GT.

Figure 5A:
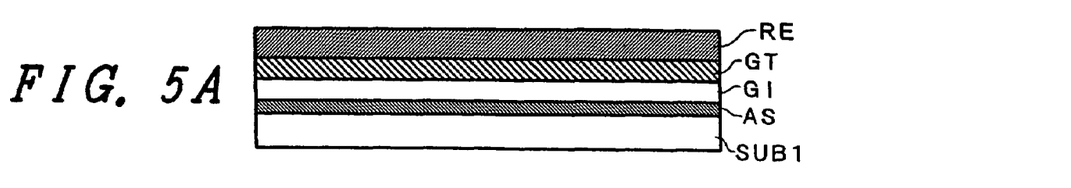
FIG. 5A to FIG. 5D are process flow diagrams showing another embodiment of a method of fabricating a display device according to the present invention.
Figure 5B:
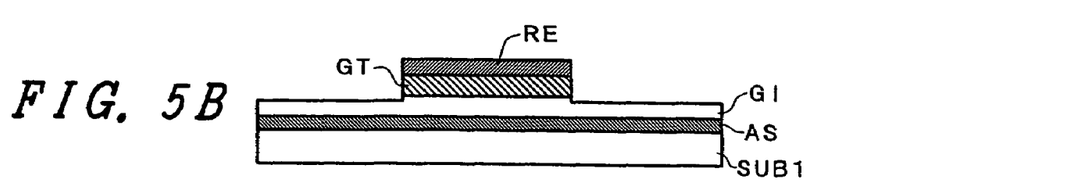

As shown in FIG. 5B, first of all, although the metal layer is allowed to remain on the channel region and the portions disposed at both sides of the channel region of the thin film transistor TFT, the photo resist film RE which works as the mask is formed as a film having a uniform thickness.

With respect to the photo resist film RE which is allowed to remain in this manner, the metal layer exposed from the photo resist film RE is etched and the semiconductor layer AS is doped with the n-type impurity of high concentration so that the drain and the source regions are formed.

Then, using the photo resist film RE as a mask, the metal film which is exposed from the mask is etched and, thereafter, the photo resist film RE is subjected to an ashing process.

Figure 7:
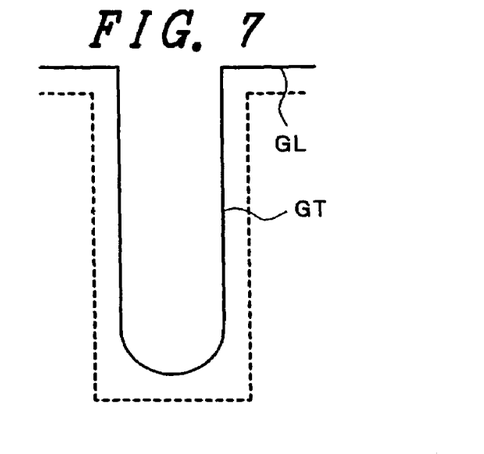
FIG. 7 is a diagram showing a pattern of a gate electrode of a thin film transistor manufactured by a step shown in FIG. 5A to FIG. 5D.
Figure 8A:
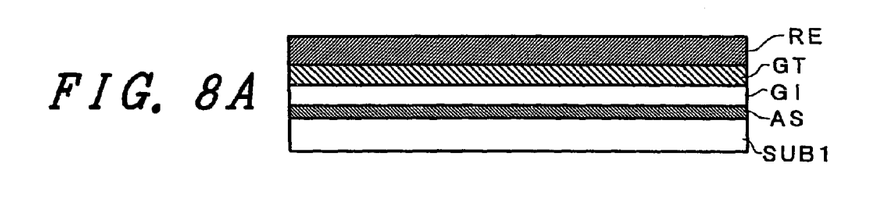
FIG. 8A to FIG. 8D are process flow diagrams showing another embodiment of a method of fabricating a display device according to the present invention.
Figure 8B:
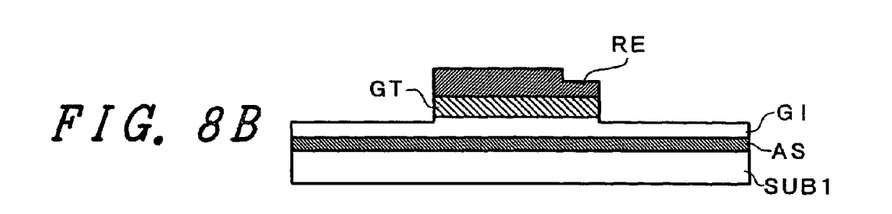
Figure 8C:
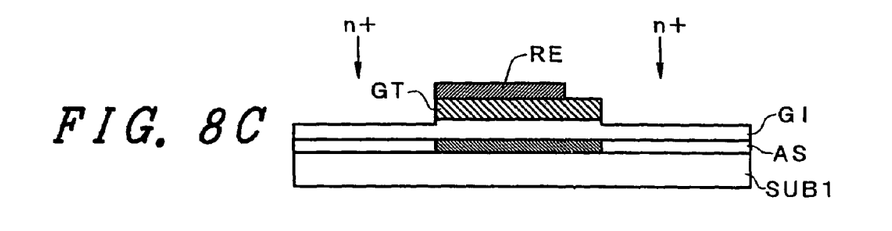
Figure 8D:
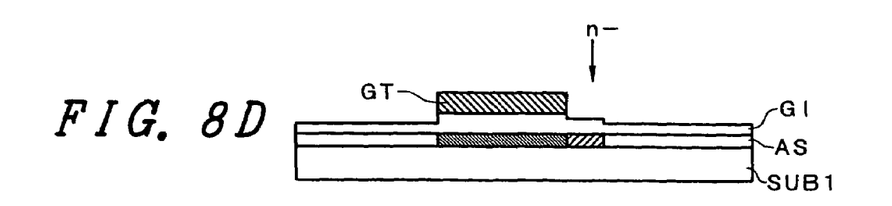

Accordingly, the photo resist film RE is allowed to remain on the channel region, while the photo resist film RE is removed at the portions disposed at both sides of the channel region. In this case, the remaining photo resist film RE exhibits a pattern indicated by a solid line in FIG. 7 (the pattern being similar to a pattern of the gate electrode GT). In FIG. 7, a pattern indicated by a dotted line is a pattern before the photo resist film is subjected to the ashing process. In this manner, the gate electrode GT of the thin film transistor TFT formed according to this embodiment is eventually formed to have a round shape at the end thereof.

With respect to the photo resist film RE which is allowed to remain in this manner, the metal layer which is exposed from the photo resist film RE is etched and the semiconductor layer AS is doped with the n-type impurity of low concentration.

Fabricating Method of Complementary Thin Film Transistor

The thin film transistor TFT in the above-mentioned embodiment is the thin film transistor TFT formed in the pixel region. However, the scanning driving circuit V or the video driving circuit He, which is formed in the periphery of the liquid crystal display part as shown in FIG. 2, is also formed of a large number of thin film transistors TFT. Accordingly, it is needless to say that the present invention is also applicable to formation of these thin film transistors TFT.

In this case, as the thin film transistors TFT which form each driving circuit, the thin film transistors of a complementary type consisting of a p-channel type transistor and an n-channel type transistor are popularly used; and, hence, one embodiment of the method of fabricating the complementary type thin film transistors TFT will be explained in conjunction with FIG. 6A to FIG. 6F.

Figure 6A:
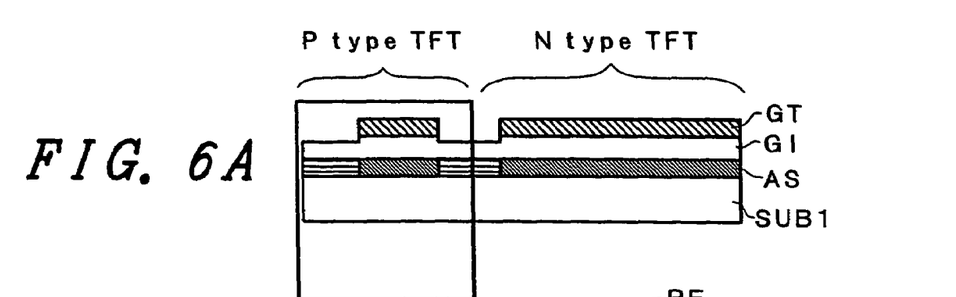
FIG. 6A to FIG. 6F are process flow diagrams showing another embodiment of a method of fabricating a display device according to the present invention.

Step 1. (FIG. 6A)

First of all, since it is unnecessary for the p-type thin film transistor TFT, which constitutes one of the complementary type thin film transistors TFT which are arranged adjacent to each other to form the LDD regions, after forming the gate electrode, the p-type impurity of high concentration is implanted into the semiconductor layer AS using the gate electrode as a mask. In this case, the region where n-type thin film transistor TFT is formed is a region which is formed by sequentially laminating the semiconductor layer AS made of polysilicon, the insulation film GI and the metal layer GT from the substrate SUB1 side.

Figure 6B:
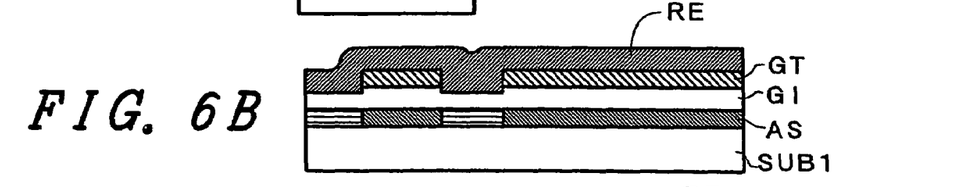

Step 2. (FIG. 6B)

The photo resist film RE is formed over the entire surface of the transparent substrate SUB1 by coating, for example.

Figure 6C:
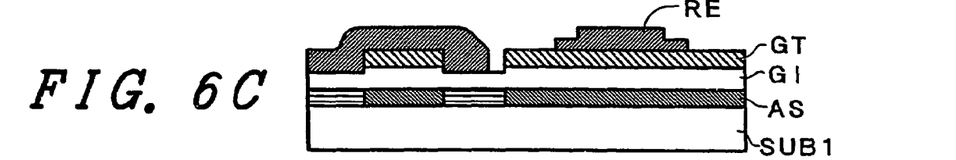

Step 3. (FIG. 6C)

The photo resist film RE is selectively exposed using the photo mask. In this case, the whole area of the region where the p-type thin film transistor TFT is formed is fully shielded from light such that the photo resist film remains on the whole area of the region where the p-type thin film transistor TFT is formed, while the region where the n-type thin film transistor TFT is formed is selectively exposed.

The exposure at the region where the n-type thin film transistor TFT is formed is the above-mentioned half exposure. Accordingly, by developing the photo resist film RE thereafter, the photo resist film RE is formed such that the photo resist film RE has a large film thickness on the channel region and a thin film thickness on the portions disposed at both sides of the channel region.

Figure 6D:
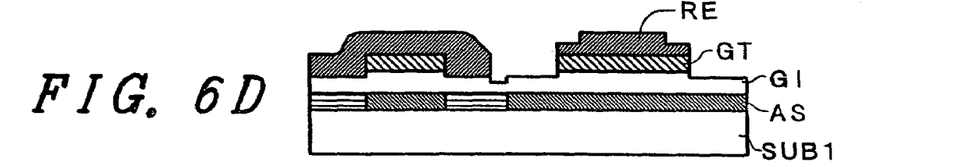

Step 4. (FIG. 6D)

Using the remaining photo resist film RE as a mask, the metal layer GT which is exposed from the mask is selectively etched so that the insulation film GI is exposed. In this case, the exposed insulation film GI has a surface that is slightly etched and has a film thickness smaller than that of the insulation film below the mask.

Figure 6E:
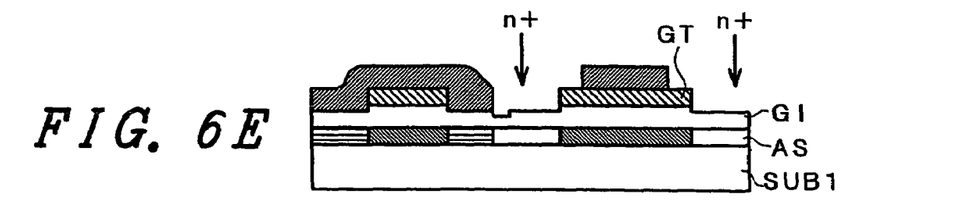

Step 5. (FIG. 6E)

Further, the ion implantation of the n-type impurity of high concentration is performed in the state in which the mask remains. Accordingly, at portions other than the region where the mask is formed, ions of n-type impurity of high concentration are implanted into the semiconductor layer below the insulation film GI so that the drain and source regions are formed.

By ashing the remaining photo resist film, the surface of the photo resist film is removed, while a portion of the surface is allowed to remain. That is, the ashing process is performed until the remaining photo resist film currently remaining on the channel region having a large film thickness is allowed to remain, and the remaining photo resist film currently remaining on the portions disposed at both sides of the channel region having a small film thickness is removed.

Using the remaining photo resist film as a mask, the metal layer which is exposed from the mask is etched to form the gate electrode GT. Accordingly, the insulation film GI is exposed and the surface of the exposed insulation film GI is slightly etched to have a film thickness smaller than a film thickness of the insulation film GI below the mask.

Figure 6F:
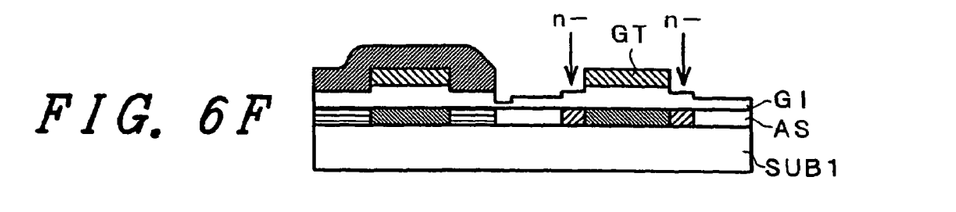

Step 6. (FIG. 6F)

Further, the ion implantation of the n-type impurity of low concentration is performed in the state in which the mask remains. Accordingly, at portions other than the region where the mask is formed, the p-type impurity of low concentration is implanted into the semiconductor layer AS below the insulation film GI. Other structure of thin film transistor TFT and forming method thereof In the above-mentioned thin film transistor TFT, the LDD regions are formed at both sides of the channel region such that the channel region is sandwiched by the LDD regions. However, it is needless to say that the LDD regions may be constituted at region sides into which the current flows (for example, the drain region sides).

Also, in this case, as can be explicitly understood from the process flow steps shown in FIG. 8A to FIG. 8D, the above-mentioned advantageous effect can be obtained by employing half exposure in the formation of the gate electrode.

Figure 9A:
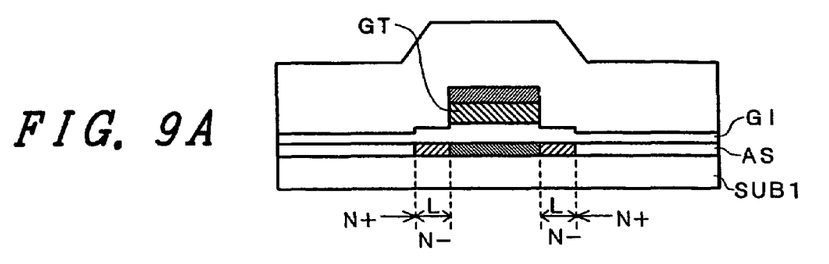
FIG. 9A and FIG. 9B are process flow diagrams showing another embodiment of a method of fabricating a display device according to the present invention.
Figure 9B:
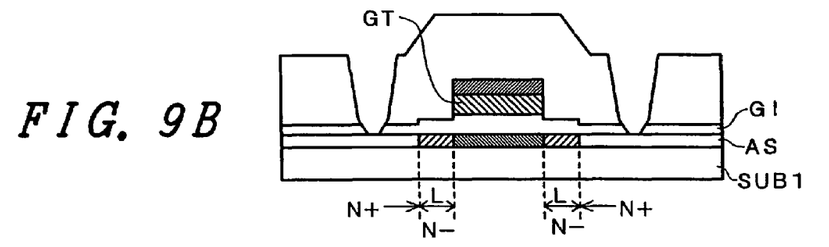

FIG. 9A and FIG. 9B show subsequent steps which follow the above-mentioned TFT fabricating process. After removing the resist remaining in a channel form, the interlayer insulation film, which is made of silicon oxide or the like, is formed over the source/drain regions and the gate electrode. Although the invention is not so limited, it is preferable that the film thickness of the interlayer insulation film is not less than 400 nm. After forming the interlayer insulation film, first of all, dry etching (anisotropic etching) is performed so as to form holes having a depth reaching the mid portion of the interlayer insulation film.

Then, wet etching (isotropic etching) is performed to grow the holes to the source/drain region to form the contact holes. Accordingly, the inclination of lower portions of the contact holes becomes gentler than the inclination of upper portions of the contact holes. Thereafter, a conductive material, such as metal, is filled in the contact holes by deposition or the like, thus establishing contact with the source/drain regions. Accordingly, it is possible to connect the source/drain regions with video signal lines or pixel electrodes.

Here, the contact holes are formed by performing dry etching first and then performing wet etching so that the regions where the contact holes are formed can be narrowed compared to a case in which the contact holes are formed only by wet etching. Accordingly, it is possible to increase the numerical aperture in the display region of the liquid crystal display device, while it is possible to enhance the integrity of the thin film transistors TFT with respect to the peripheral region of the liquid crystal display device or a display device other than the liquid crystal display device.

In the above-mentioned explanation, the holes are formed to a depth which reaches the mid portion of the interlayer insulation film by the first dry etching. However, in the formation of the holes by dry etching, the hole may reach a position around a boundary between the interlayer insulation film and the gate insulation film GI or the middle portion of the gate insulation film. That is, the inclination of the side surfaces of the contact holes is changed at a position around the boundary between the interlayer insulation film and the gate insulation film.

By performing the formation of the holes using dry etching such that holes reach a position near the source/drain regions, the regions where the contact holes are formed can be further narrowed. However, the control of dry etching becomes strict. Accordingly, it is advantageous to change the proportions of dry etching and wet etching by taking the restriction on the area of the contact regions and the accuracy of dry etching into consideration.

Figure 10A:
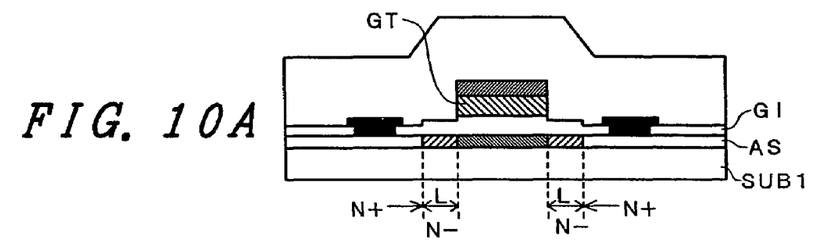
FIG. 10A and FIG. 10B are process flow diagrams showing another embodiment of a method of fabricating a display device according to the present invention.
Figure 10B:
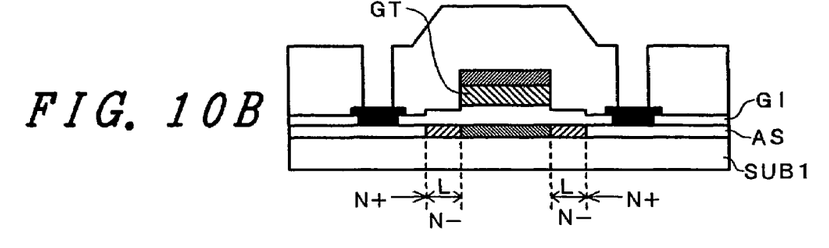

FIG. 10A and FIG. 10B show a constitution which allows the formation of contact holes using only dry etching. Due to such a constitution, it is possible to further narrow the regions of the contact holes compared to the constitution shown in FIG. 9A and FIG. 9B. However, when the contact holes are formed using only dry etching, the source/drain regions made at polysilicon are also etched by dry etching. Accordingly, before forming the interlayer insulation film, portions of the gate insulation film over the source/drain regions are removed and metal films are formed over the portion other than the removed portions. After forming the metal films, the interlayer insulation film is formed; and, thereafter, the interlayer insulation film disposed at the regions where the metal films are formed is removed by dry etching. Accordingly, the metal films form block layers for dry etching, so that the source/drain regions are prevented from being etched.

Figure 11:
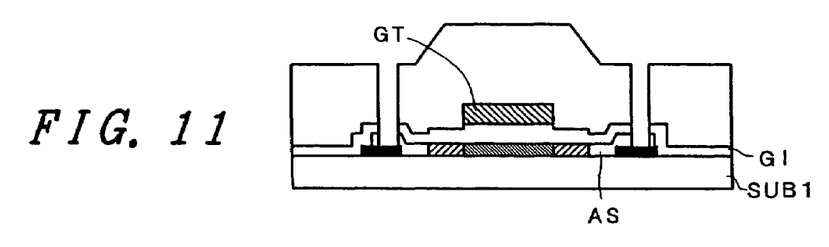
FIG. 11 is a diagram showing another embodiment of a method of fabricating a display device according to the present invention.
Figure 12A:
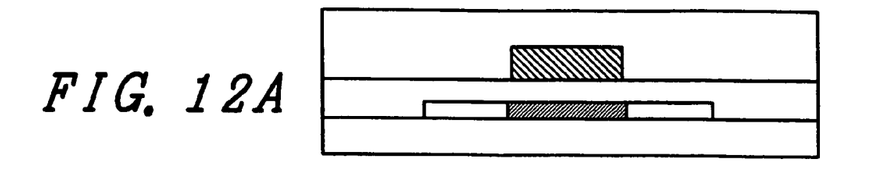
FIG. 12A to FIG. 12G are process flow diagrams showing another embodiment of a method of fabricating a display device according to the present invention.
Figure 12B:
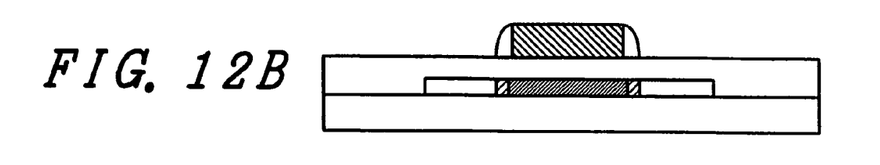
Figures 12C, 12D:
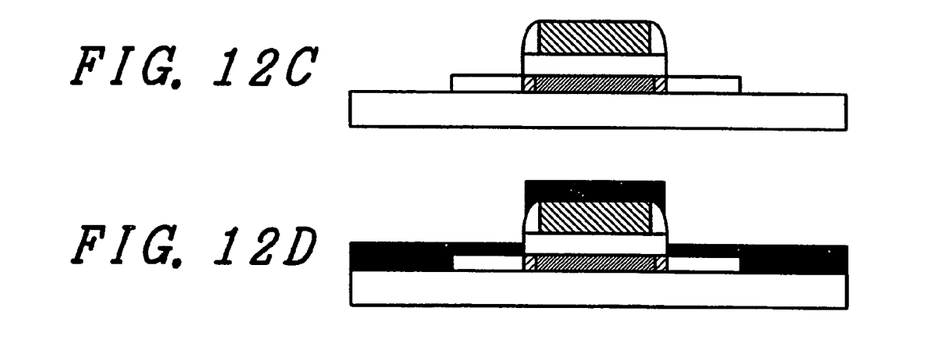
Figure 12E:
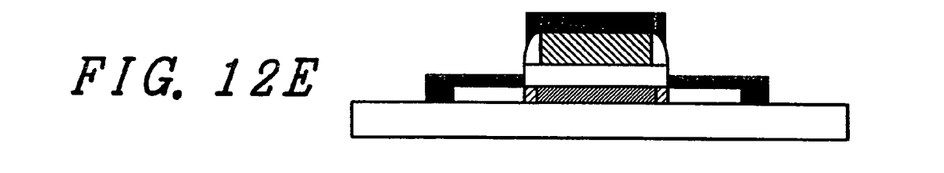
Figure 12F:
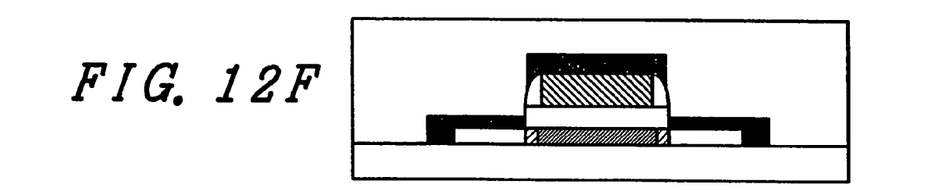
Figure 12G:
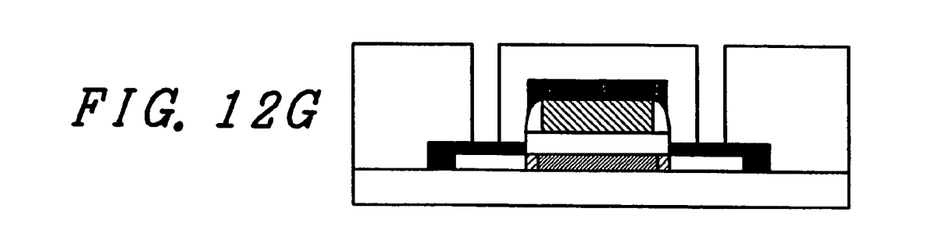

In the constitution shown in FIG. 11, before performing the aboveumentioned series of steps, metal films are formed at portions where contacts of the source/drains are formed. That is, metal films are formed over the substrate, polysilicon films are formed over upper portions of the metal films, and thereafter, the source/drain regions are formed by performing the above-mentioned steps to form the interlayer insulation film. Thereafter, the interlayer insulation film and the gate insulation film on the source/drain regions are etched by dry etching. Here, the polysilicon films on the source/drain regions are simultaneously etched by dry etching and, eventually, the holes are formed in the interlayer insulation film, the gate insulation film and the polysilicon films. In this state, by filling the conductive material, such as metal, into the contact holes, the source/drain regions are electrically connected with the conductive material in the contact holes through a metal layer formed as a layer disposed below the polysilicon film.

In the above-mentioned constitutions shown in FIG. 10A, FIG. 10B and FIG. 11, it is necessary to form metal layers on upper surfaces or lower surfaces of the source/drain regions, and hence, the number of steps is increased. However, since the contact holes can be formed only by dry etching, the contact regions can be further narrowed.

FIG. 12A to FIG. 12G show another embodiment in which the contact holes of the source/drains are formed only by dry etching. The LDD structures are formed by forming side walls on side surfaces of the gate electrode, and thereafter, a metal film and an interlayer insulation film are formed over the source/drain regions and the gate electrode, and then, the interlayer insulation film is etched by dry etching, thus establishing the contact with the source/drain regions.

In such a constitution, the metal film which constitutes an etching stop layer is formed over the source/drain regions, so that polysilicon which forms the source/drain regions can be prevented from being etched.

In applying this technical concept to the method of fabricating a thin film transistor, which has been explained in conjunction with FIG. 4A to FIG. 4E, at the time of removing the gate electrodes other than the channel region by etching to implant ihe ions of low concentration, the gate insulation film over the region to which the ions of high concentration have been implanted is also removed. Thereafter, after implanting the ions of low concentration, a metal film is formed over the source/drain regions and the gate electrode. Then, an interlayer insulation film is formed over the whole surface of the source/drain electrode and contact holes are formed by dry etching.

In such a constitution, since the metal film is formed over the source/drain regions, there is no possibility that the polysilicon of the source/drain regions is also etched by dry etching. Here, however, it is necessary to deposit the metal film with a thickness which can prevent the short-circuiting of the gate electrode and the source/drain regions through the metal film. Further, at the time of implanting ions of low concentration, since the gate insulation film which constitutes a through film is not present over the source/drain regions, there still remains the possibility that the impurity is also introduced into the polysilicon. Accordingly, provided that the gate electrode and the source/drain regions are not short-circuited to each other and the possibility of introduction of the impurity to the polysilicon is or is allowed to be low, by adopting this constitution, the steps can be simplified and, at the same time, the contact regions can be narrowed. It is needless to say that the above-mentioned constitution is applicable to the constitutions shown in FIG. 5A to FIG. 5D, FIG. 6A to FIG. 6F and FIG. 8A to FIG. 8D.

FIG. 6A to FIG. 6F show steps in which the gate electrodes of the p-type thin film transistor and the n-type thin film transistor are formed first, and then, the source/drain regions of the p-type thin film transistor are formed, and then n-type thin film transistor is formed. However, the present invention is not limited to such steps. For example, it may be possible to adopt steps in which, at the time of first forming the gate electrode of the n-type thin film transistor having the LDD structures, the gate electrode of the p-type thin film transistor is simultaneously formed; and, thereafter, the p-type thin film transistor may be formed by masking the n-type thin film transistor portion in which the source/drain regions are formed by the ion implantation. In this case, although phosphorus is also implanted into the regions which constitute the source/drain regions of the p-type thin film transistor, by masking the n-type thin film transistor after forming the n-type thin film transistor and implanting boron into the source/drain region of the p-type thin film transistor by an amount that is twice as much as the amount of phosphorus, the p-type thin film transistor can be realized. Here, although the order of forming the n-type thin film transistor and the p-type thin film transistor may be reversed, since the source/drains implanted with boron in an amount larger than phosphorus is liable to be activated, it is preferable to form the p-type thin film transistor after forming the n-type thin film transistor.

In the above-mentioned explanation of the half exposure processing, although the light shielding film formed over the photo mask is formed to have a mesh shape, the shape of the light shielding film is not specifically limited. Accordingly, the light shielding film in a stripe shape may be used and any constitution is applicable, so long as the light shielding film constitutes a photo mask which can form portions which are exposed to an intermediate level between the completely exposed level and the completely non-exposed level.

Further, in the above-mentioned fabricating steps in the formation of the thin film transistor, there has been disclosed a case in which, after forming the regions which are implanted with the ions of high concentration in the source/drain regions, resist having a large film thickness is allowed to remain over the channel forming region, and resist films of a small film thickness disposed at the sides of the channel forming region are subjected to an ashing process. However, it may be possible to implant the ions after performing the ashing process. In this case, since the resist is subjected to the ashing process before the resist is hardened by the ion implantation, it is possible to enhance the accuracy of the retraction of the resist.

Figure 5C:
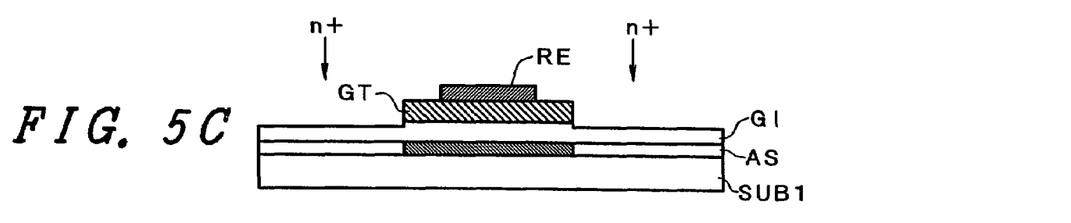
Figure 5D:
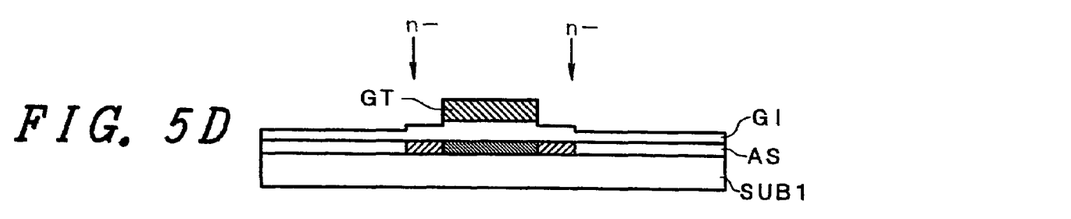

With respect to the above-mentioned explanation of steps shown in FIG. 5A to FIG. 5D, the following explanation may conform to the drawings more precisely. That is, the ions of high concentration are implanted in the state shown in FIG. 5B, and, thereafter, the resist is subjected to the ashing process such that the width of the resist becomes the width of the channel region of the thin film transistor, as shown in FIG. 5C, the metal film is etched using the remaining resist as a mask, and ions of low concentration are implanted after the metal film is etched, as shown in FIG. 5D. It is needless to say that the order of the implantation of the ions of high concentration and the ashing of the resist which allows the channel region to remain can be reversed.

Heretofore, although the invention has been explained in this specification based on a thin film transistor of the type used in a general liquid crystal display device having the constitution in which the pixel electrodes are formed over one substrate and the counter electrode is formed over the other substrate, the present invention is also applicable to a thin film transistor for use in a liquid crystal display device of the transverse electric field type (IPS) which forms pixel electrodes and a counter electrode in one substrate and drives liquid crystal in the direction parallel to the substrate. It is needless to say that the present invention is also applicable to a thin film transistor adopted by an organic EL display device or the like which uses electro-luminescence. Further, in the above-mentioned display device, it is possible to apply the present invention to only one group of thin film transistors out of a group of thin film transistors provided in the display region and a group of thin film transistors provided in the peripheral region around the display region. Further, although in the above-mentioned explanation a display device is considered in which the peripheral circuit region is constituted of complementary thin film transistors and the pixel regions are constituted of single-conductive-type thin film transistors, the present invention is not specifically limited to such a display device. That is, the present invention is applicable to a display device in which a peripheral region thereof is constituted of only either p-type or n-type thin film transistors. Further, the present invention is applicable to a display device in which a display region thereof is constituted of p-type and n-type conductive thin film transistors.

As can be clearly understood from the above-mentioned explanation, according to the display device of the present invention, the numerical aperture can be enhanced, and drawbacks which may be caused by stepped portions formed in the periphery of the gate electrode of the thin film transistor can be solved.

Further, according to the method of fabricating the display device of the present invention, the voltage for performing the ion implantation of an impurity at the time of forming the thin film transistor can be reduced.

What we claim is:

1. A display device comprising:
   an insulation substrate,
   a semiconductor layer formed over the substrate, and comprising a channel region, source region and drain region,
   an insulation film formed on the channel region, source region and the drain region, and
   a gate electrode formed on the insulation film,
   wherein at least one LDD region is formed between the channel region and the source region, or between the channel region and the drain region,
   wherein the insulation film has a first thickness on the channel region that is not more than 100 nm, a second thickness on the LDD region, and a third thickness on the source region or the drain region, the first thickness being greater than the second thickness, and the second thickness being greater than the third thickness, and
   wherein the insulation film thickness has a step-like transition between the first thickness thereof on the channel region and the second thickness thereof on the LDD region.

2. A display device according to claim 1,
   wherein the LDD region is formed between the channel region and the source region, and between the channel region and the drain region.

3. A display device according to claim 2, wherein the third thickness is not more than 80 nm.

4. A display device according to claim 3, wherein the second thickness is not more than 90 nm.

5. A display device according to claim 2,
   wherein the third thickness is thinner than the first thickness by not less than 20 nm.

6. A display device according to claim 2, wherein the difference between the second thickness and the third thickness is larger than the difference between the first thickness and the second thickness.

7. A display device according to claim 1,
   wherein the semiconductor layer is comprised of polysilicon.

8. A display device according to claim 7,
   wherein the LDD region is formed between the channel region and the source region, and between the channel region and the drain region.

9. A display device according to claim 7, wherein the third thickness is not more than 80 nm.

10. A display device according to claim 7, wherein the second thickness is not more than 90 nm.

11. A display device according to claim 7,
    wherein the third thickness is thinner than the first thickness by not less than 20 nm.

12. A display device according to claim 7, wherein the difference between the second thickness and the third thickness is larger than the difference between the first thickness and the second thickness.

13. A display device according to claim 1, wherein the change in thickness of the insulation film between the first region and the second region thereof and between the second region and the third region thereof forms a step-like gradient, respectively.

* * * * *